United States Patent
Fitzi

(10) Patent No.: US 11,355,547 B2
(45) Date of Patent: Jun. 7, 2022

(54) IMAGE SENSOR, IMAGE SENSOR ARRANGEMENT AND COMPUTED TOMOGRAPHY APPARATUS INCLUDING THE SAME

(71) Applicant: ams International AG, Jona (CH)

(72) Inventor: Andreas Fitzi, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 0 days.

(21) Appl. No.: 17/269,078

(22) PCT Filed: Aug. 8, 2019

(86) PCT No.: PCT/EP2019/071330
§ 371 (c)(1),
(2) Date: Feb. 17, 2021

(87) PCT Pub. No.: WO2020/038731
PCT Pub. Date: Feb. 27, 2020

(65) Prior Publication Data
US 2021/0175275 A1    Jun. 10, 2021

(30) Foreign Application Priority Data

Aug. 21, 2018  (EP) .................................... 18190046

(51) Int. Cl.
*H01L 27/146* (2006.01)
*G01N 23/046* (2018.01)
*H04N 5/3745* (2011.01)

(52) U.S. Cl.
CPC ..... *H01L 27/14659* (2013.01); *G01N 23/046* (2013.01); *H01L 27/14623* (2013.01); *H01L 27/14636* (2013.01); *H04N 5/37455* (2013.01)

(58) Field of Classification Search
CPC ......... H01L 27/14659; H01L 27/14623; H01L 27/14636; H01L 27/14663; G01N 23/046; H04N 5/37455; G01T 1/2018
See application file for complete search history.

(56) References Cited

U.S. PATENT DOCUMENTS

| 2013/0136233 | A1  | 5/2013  | Okada |
| 2015/0285763 | A1* | 10/2015 | Pan ................... G01N 27/44721 |
|              |     |         | 204/612 |
| 2016/0211296 | A1  | 7/2016  | Kobayashi et al. |

FOREIGN PATENT DOCUMENTS

| DE | 102013206404 B3 | 3/2014 |
| EP | 2950345 A1      | 12/2015 |

(Continued)

OTHER PUBLICATIONS

Shin et al., "14.3-bit extended counting ADC with built-in binning function for medical Xray CMOS imagers", Electronics Letters, vol. 48, No. 7, Mar. 29, 2012, 2 pages.

(Continued)

*Primary Examiner* — Kiho Kim
(74) *Attorney, Agent, or Firm* — MH2 Technology Law Group LLP

(57) ABSTRACT

An image sensor includes a multitude of photodiodes and analog-to-digital converters disposed in adjacent first and second portions of a semiconductor substrate. The photodiodes exhibit X-ray radiation tolerance. An arrangement of several image sensors in adjacent rows can be used for an X-ray detector in a computed tomography apparatus.

18 Claims, 4 Drawing Sheets

(56) References Cited

FOREIGN PATENT DOCUMENTS

| | | | |
|---|---|---|---|
| EP | 3331034 A1 | 6/2018 | |
| JP | 2011097418 A * | 5/2011 | ....... H01L 27/14609 |
| JP | 2018117117 A | 7/2018 | |
| WO | 2006104641 A2 | 10/2006 | |
| WO | 2012145038 A1 | 10/2012 | |
| WO | 2017070299 A1 | 4/2017 | |
| WO | 2018090163 A1 | 5/2018 | |

OTHER PUBLICATIONS

International Search Report and Written Opinion in corresponding International Application dated Jan. 16, 2020, 19 pages.

* cited by examiner

IMAGE SENSOR, IMAGE SENSOR ARRANGEMENT AND COMPUTED TOMOGRAPHY APPARATUS INCLUDING THE SAME

CROSS REFERENCE TO RELATED APPLICATIONS

This application is the national stage entry of International Patent Application No. PCT/EP2019/071330, filed on Aug. 8, 2019, which claims the benefit of priority of European Patent Application No. 18190046.5, filed on Aug. 21, 2018, all of which are hereby incorporated by reference in their entirety for all purposes.

TECHNICAL FIELD

The present disclosure relates to an image sensor. Specifically, the present disclosure relates to an image sensor including a semiconductor substrate, photodiodes, analog-to-digital converters and electrical connections. The present disclosure relates also to an arrangement of several image sensors on a substrate and to a computed tomography apparatus that includes an image sensor arrangement.

BACKGROUND

Image sensors may be used in computed tomography (CT) equipment to record an image of a human person, an animal or an object in response to X-ray radiation. The image sensors are a vital part in the performance of the CT apparatus and a major cost factor.

Conventional image sensors for CT applications may be composed of two bonded semiconductor substrates having the photodiodes in one of the substrates and the analog-to-digital converters (ADCs) in the other substrate. This process requires preprocessing and bonding of two semiconductor wafers and the forming of through silicon vias (TSVs) to connect the photodiodes at one side of the wafer sandwich to the ADCs at the other side of the sandwich. The use of two wafers and TSVs is a complex and cost-expensive process.

Another conventional image sensor for CT applications includes photodiodes and ADCs next to one another at one side of a semiconductor substrate, wherein TSVs provide connections to external terminals at another side of the substrate. This process is also rather expensive and the area for the ADCs at the front side of the substrate reduces the resolution of the sensor.

There is a need for an image sensor to be used in CT applications that avoids the above-mentioned drawbacks. In particular, an image sensor targeting to lower-end CT applications should have a good image resolution while requiring a less complex manufacturing process to meet cost expectations.

SUMMARY

An image sensor according to an aspect of the present disclosure comprises a semiconductor substrate having a first portion and a second portion. The semiconductor substrate may be a n- or p-doped silicon wafer to be used in a complementary metal oxide semiconductor (CMOS) manufacturing process.

A multitude of photodiodes that are configured to convert received electromagnetic radiation such as visible light into an electrical signal are disposed in the first portion of the semiconductor substrate. As the photodiodes are used in an X-ray environment, they should exhibit X-ray radiation tolerance. Although the photodiodes may be covered with a protective layer so that the X-ray radiation does not directly impinge on the photodiodes, at least a small portion of X-ray radiation may penetrate through the protection mechanism so that the photodiodes should be X-ray radiation tolerant. The photodiodes should have a structure, the performance of which does not suffer from the reception of X-ray radiation. Various possibilities for an X-ray radiation tolerant arrangement of semiconductor layers are known to a skilled person. A particular X-ray radiation tolerant photodiode structure useful for the present disclosure is described herein below.

Analog-to-digital converters (ADCs) are provided to convert the electrical analog signals generated by the photodiodes into digital signals to allow further digital processing. The ADCs are disposed in the second portion of the semiconductor substrate. Each one of the ADCs is associated to one of the photodiodes so that there is a one-to-one relation between photodiodes and ADCs to ensure fast processing of the signals without dead time. Almost all radiation is converted into image information so that an examined person is not subjected to unnecessary excess radiation.

Electrical connections such as connection vias are provided to connect each one of the photodiodes to an associated one of the ADCs. The electrical connections may be buried in the semiconductor substrate so that more active surface is available for the photodiodes. Alternatively, the electrical connections may be disposed in one or more dielectric layers on the semiconductor substrate, which uses a tolerable amount of surface area and can be fabricated with a standard, cost-effective CMOS manufacturing process.

According to an embodiment, a X-ray radiation tolerant photodiode comprises a semiconductor substrate of a first conductivity type and a doped well region of a second conductivity type opposite the first conductivity type disposed in the semiconductor substrate. The doped well faces to a surface of the semiconductor substrate to receive radiation such as UV radiation, human-visible light or infrared light. In an embodiment, the photodiode is configured to receive visible light and convert it into an analog electrical signal. A relatively shallow doped surface region of the first conductivity type is disposed in the upper portion of the semiconductor substrate having a doping concentration higher than the doping concentration of the semiconductor substrate to achieve X-ray radiation tolerance. The doped surface region surrounds the doped well region. The doped surface region reduces leakage charges generated by the reception of a higher-energy radiation such as an X-ray radiation. The doped surface region may be achieved by a shallow implantation that generates the surface passivation for the spectrum range of interest without having an adverse effect on the capacitance of the photodiode. The photodiode has a high sensitivity and achieves a low dark current that does almost not increase after an X-ray irradiation. In an embodiment, the first conductivity type may be generated by p-dopants and the second conductivity type may be generated by n-dopants.

According to an embodiment, the doped well region can be surrounded by another doped well region of the first, e.g., p-doped conductivity type. The other doped well region may be in contact with the doped well region and the doped surface region to ensure that the doped surface region of the, e.g., p-type has good contact to the doped well region of the, e.g., n-type.

According to an embodiment, each one of the photodiodes comprises a multitude of doped well regions that may be interconnected with each other through electrical wires disposed on top of the substrate in a dielectric layer. Accordingly, one photodiode includes a multitude of islands of the, e.g., n-well type that contribute to the photoactive area of the photodiode to generate a relatively high contact surface between n- and p-doped regions at the semiconductor surface. The above-described arrangement of layers for a photodiode is described in more detail in EP patent application publication EP 3 331 034 A1, herein included by reference. X-ray radiation tolerant or X-ray radiation hard photodiode structures are also disclosed in other prior art references and may also be useful for the realization of an image sensor according to aspects of the present disclosure.

The area of semiconductor substrate covered by a photodiode is relatively large compared to photodiodes designed for other fields of application different from computed tomography. While camera applications may use photodiodes in the range of micrometers or less to achieve an as high as possible pixel resolution, the area of the photodiodes for CT applications is in the range of millimeters. According to embodiments, the photodiodes may occupy a semiconductor substrate area in the range of between 0.5 mm×0.5 mm and 2.0 mm×2.0 mm. A practical range may be at 1.0 mm×1.0 mm. Projectable future developments tend to achieve a range down to 0.1 mm×0.1 mm and up to 2.5 mm×2.5 mm. These ranges allow the reception of a sufficient amount of radiation to generate an electrical signal of a suitable dynamic range, on the one hand, and enable sufficient resolution of a recorded image of a to be examined human being, an animal or an object.

According to an embodiment, the image sensor may be covered with a wavelength conversion layer that converts the received X-ray radiation to an electromagnetic radiation of a longer wavelength such as UV light, visible light or infrared light. Specifically, the wavelength conversion layer converts from X-ray radiation to human visible light radiation that can be detected by the photodiodes. The wavelength conversion layer may be a scintillator that converts X-rays into visible light. The wavelength conversion layer or the scintillator may be disposed continuously on the surface of the image sensor continuously covering the array of photodiodes. According to another embodiment, the wavelength conversion layer or scintillator may be disposed on each photodiode individually. While a pixel-wise scintillator layer exhibits good conversion quality, a continuous layer may be fabricated more easily, however, requires the consideration of crosstalk between photodiodes.

According to an embodiment, the analog-to-digital converters may be also covered by a wavelength conversion layer or a scintillator. Alternatively, it is possible to use an X-ray radiation shield such as a metal layer, e.g., tungsten layer disposed on the ADCs for X-ray protection. A similar wavelength conversion layer or X-ray radiation shield may also be disposed on other electronic elements disposed in the second portion of a semiconductor substrate.

According to an embodiment, the semiconductor substrate may have a rectangular or a square shape, wherein the rectangle or the square has first and second edges disposed at opposite ends of the semiconductor substrate. The first and second portions that include either the photodiodes or the ADCs are continuous areas disposed one adjacent to the other one. The first portion includes one of the first and second edges, while the second portion includes the other one of the first and second edges.

According to an embodiment, a parallel-to-serial interface may be provided in the second portion of the substrate that includes a parallel port and a serial port to convert the signals received from the ADCs connected to the parallel port to a serial bit stream at the serial port. Output terminals at the serial port forward the serial bit stream of the image information to circuitry outside the image sensor. The serial bit stream may be supplied to the picture processing algorithms running on the computing device in the CT apparatus. Practically, one image sensor includes one serial output port that may be configured as a two-wire port providing a differential signal. The serial port may be configured as a low voltage differential signaling interface (LVDS) which is a standardized physical interface dedicated to serial high speed data transmission.

According to an embodiment, with a more detailed view on the array of photodiodes, the photodiodes may be arranged in rows. Subsets of photodiodes may be disposed in corresponding rows, wherein one row is disposed adjacent to another one. The ADCs associated to the photodiodes of one of the rows are disposed opposite that row, and opposite the photodiode that forms an end of said row. It is useful to maintain a certain distance between the photodiode at the end of the row next to the electronic circuits and the electronic circuits receiving the signals from the photodiodes such as the ADCs. The distance should be sufficient to ensure thermal decoupling between the photodiodes and the ADCs to ensure that the heat generated by the digital operation of the ADCs does not couple into the photodiodes. Using a suitable distance between the photodiode at the end of a row and the ADCs ensures a uniform sensitivity of the photodiodes across the array. Furthermore, in case of a gap between scintillators and/or X-ray radiation shields on the photodiodes and the ADCs, respectively, a distance between the photodiodes and the ADCs ensures that no X-ray radiation reaches the photodiodes/ADCs through a discontinuity of said materials. A useful size of the distance is at least 100 µm. Practically, the distance may be in the range between 100 and 200 µm. Depending on the materials used to protect the photodiodes and the ADCs from the X-ray radiation a useful distance may be even more than 200 µm.

According to an embodiment, a yet closer view onto the structure of the image sensor shows a matrix arrangement of the multitude of photodiodes comprising rows and columns. The analog-to-digital converters associated to the photodiodes of one of the rows are disposed in spatial vicinity with the corresponding row. The analog-to-digital converters associated to the photodiodes of one of the rows are disposed beside the corresponding row as described above. The pitch of rows of photodiodes is related to the pitch of ADCs associated with the corresponding row of photodiodes. When the semiconductor substrate has a rectangular shape, the photodiodes are disposed proximate one of the edges of the rectangle and are distant from another one of the edges. The ADCs are disposed proximate the other one of the edges and distant from the one of the edges. It is useful to fabricate the electrical connections between photodiodes and associated ADCs in one or more dielectric layers above the semiconductor substrate so that the connecting wires are situated between two adjacent rows. The space required for said wires is relatively small so that the loss of photoactive area appears tolerable.

According to embodiments, one or more of the above-mentioned objects are achieved by an image sensor arrangement according to the features of present claim 11.

According to an embodiment of the present disclosure, an arrangement of a multitude of image sensors comprises image sensors disposed on a carrier substrate. The carrier substrate is a rigid substrate such as a ceramic substrate that includes wires to supply electrical power and receive electrical signals and dissipates the heat from the individual image sensors generated during their operation. The image sensors are mounted on the carrier substrate in a first and a second row, wherein each row comprises one or more image sensors. The image sensors are oriented such that the first portions of the semiconductor substrates of the image sensors of the first row and the second row that contain the photodiodes are disposed adjacent to one another. Accordingly, all the first portions of the image sensors of a first row face the first portions of the image sensors of the second row. The arrays of photodiodes of neighbouring image sensors are concatenated which each other so that a continuously extending area of photodiodes is achieved. In an embodiment, the arrangement comprises a number of 2×N image sensors that are arranged in two rows, each row including a number of N image sensors. When a row of photodiodes includes, e.g., 8 photodiodes, the butted image sensors of the first and second rows form an array of a width of 16 photodiodes, so-called 16 slices of photodiodes disposed in the X-ray detector of the CT apparatus. Current developments are directed to image sensors with rows with 16 or even 32 photodiodes so that the width of the sensor arrangement comprises 32 or 64 photodiodes or slices. The width of the image sensor arrangement is sufficient to provide an image of substantial size and resolution suitable for a good CT representation of a person, an animal or an object at reasonable complexity and costs. It is to be noted that the ADCs are disposed within the second areas of the semiconductor substrates of butted image sensors distant from one another, wherein the photodiode arrays cover the area disposed between the ADCs.

According to an embodiment, a wavelength conversion layer may be disposed on the first portions of the image sensors of each one of the first and second rows. Furthermore, either a wavelength conversion layer or a X-ray radiation shield may be disposed on the second portions of the image sensors of first and second rows protecting the electronics in the ADCs from X-ray radiation.

According to an embodiment, bond wires may be provided to connect pads on semiconductor substrates to pads disposed on the carrier substrate. The pads provide supply power such as supply potential VDD and ground potential VSS and receive differential electrical output signals containing the image information recorded by the photodiodes and converted to the digital domain by the ADCs.

In order to dissipate the heat generated in the electronic circuits on the image sensors such as the ADCs, a heat sink or heat dissipater is mounted to the carrier substrate to dissipate the heat generated in the electronic circuits and move it away from the array of photodiodes. The heat sink may be mounted in vicinity to the second portions of the semiconductor substrates that include the ADCs. This arrangement allows a direct flow of the heat generated from the ADCs to the heat sink so that the heat is removed from the photodiodes, achieving a uniform sensitivity of the photodiodes throughout the image sensor arrangement. It is to be noted that the leakage current of a photodiode depends largely on temperature.

According to embodiments, one or more of the above-mentioned objects are achieved by a computed tomography apparatus according to the features of present claim 15.

According to an embodiment, a computed tomography (CT) apparatus comprises an X-ray tube that may generate continuous X-ray radiation. An X-ray detector is disposed opposite the X-ray tube such that the radiation emitted by the X-ray tube is received in the X-ray detector. The X-ray detector comprises a multitude of the above-mentioned image sensor arrangements, which are disposed one adjacent to the other. The X-ray detector may have the shape of a cylinder surface. The width of the X-ray detector may be 16 photodiodes/slices or a multiple thereof depending on the available budget for the image sensors. The X-ray tube and the X-ray detector may rotate around a space that is configured to receive a subject or an object to be examined so that the X-ray radiation passing the subject/object is recorded in the X-ray detector. A computer may be connected to the X-ray detector to receive image information from the sensor arrangements, wherein software is installed on the computer to configure it to compute two- or three-dimensional representations from the received image information.

The CT apparatus according to an aspect of the present disclosure provides a high resolution image at reasonable complexity and costs wherein the X-ray detector comprises a multitude of image sensor arrangements composed of several image sensors forming a continuous area of photodiodes of a width of 16 photodiodes/slices or a multiple thereof.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
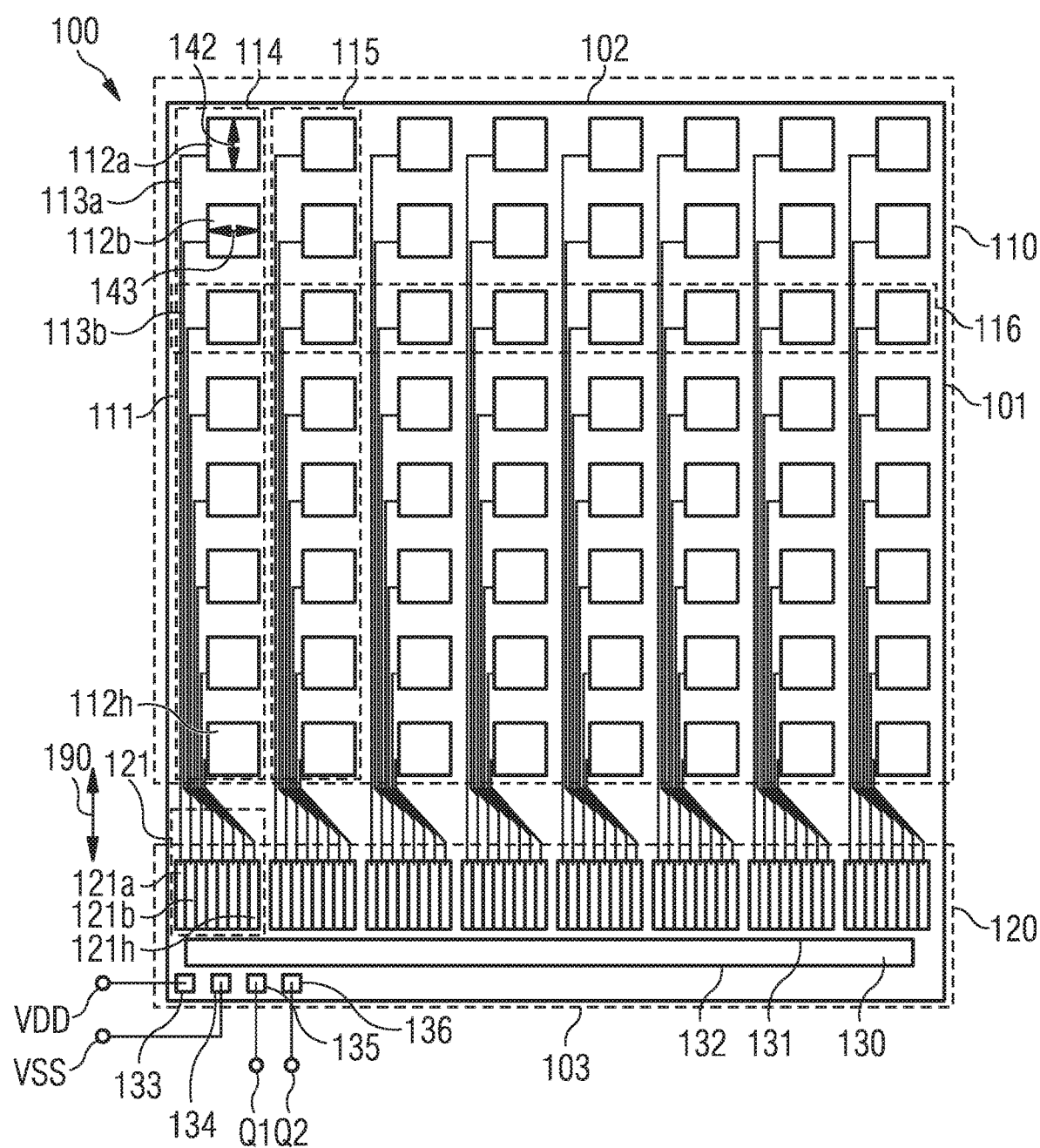
FIG. 1 shows a top view on an image sensor.

FIG. 1 depicts a top view onto an image sensor according to an aspect of the present disclosure. The image sensor 100 is realized as an integrated circuit in a semiconductor substrate 101. The semiconductor substrate has a rectangular or square shape. The semiconductor substrate rectangle includes four edges, of which edges 102 and 103 are disposed on opposite ends of the semiconductor substrate 101. The substrate 101 comprises two portions 110, 120 that include components of different function. Portions 110, 120 are continuous, non-overlapping rectangular portions, wherein portion 110 includes the edge 102 and portion 120 includes the edge 103.

The first portion 110 of the semiconductor substrate 101 includes an array of photodiodes arranged in rows and columns. The array of photodiodes includes 8×8 photodiodes disposed in eight rows and eight columns. For example, rows 114 and 115 are disposed one adjacent to the other, each one including a subset of 8 photodiodes such as photodiodes 112a, 112b, 112h disposed in row 114. Rows 114, 115 extend in vertical direction in FIG. 1, and column 116 extends in horizontal direction. The arrangement of photodiodes is in a regular matrix where the photodiodes are disposed at the intersection of rows and columns.

The second portion 120 includes analog-to-digital converters, wherein one ADC is associated to one of the photodiodes. The ADCs associated to the photodiodes of row 114 are arranged one next to the other in area 121 disposed opposite the photodiode 112h that forms the end of row 114. ADC 121a is associated to photodiode 112a, ADC 121b is associated to photodiode 112b, ADC 121h is associated to photodiode 112h. The electrical signal generated by a photodiode is supplied to the associated ADC through a wire such as wire 113a that connects photodiode 112a to ADC 121a and wire 113b that connects photodiode 112b to ADC 121b. The ADCs 121a, 121b, 121h are arranged such that they fit into the pitch defined by row 114. All the other eight rows of the image sensor 100 have a corresponding structure.

The image sensor 100 is dedicated for a computed tomography apparatus so that it meets several requirements. The image sensor receives a continuous flow of radiation and has no dead time to avoid unnecessary radiation to a person to be examined. All photodiodes or pixels of the image are measured at the same time. Except for the electrical wires that connect the photodiodes with the ADCs, the photodiodes cover as much area as possible of the semiconductor chip so that they provide as much image information as possible. The size of the photodiodes is rather large when compared to photodiodes of camera applications. In an embodiment, the vertical size 142 of a photodiode is about 1 mm (millimeter) and the horizontal size is about 1 mm. Depending on process technology, the size may vary up to about 2.5 mm×2.5 mm. With advance in process technology, it may be useful to shrink the size of the photodiodes down to about 0.1 mm×0.1 mm. In many embodiments, the size will be in the range of 0.5 mm×0.5 mm to 2.0 mm×2.0 mm.

The digital signals generated by the ADCs in the second portion 120 of the substrate are connected in a parallel-to-serial interface 130 so that they can be output from the image sensor chip through a serial interface. In an embodiment, the serial interface port 132 may be a standardized low voltage differential signaling interface (LVDS) providing two differential signals Q1, Q2 at corresponding terminal pads 135, 136 of the semiconductor chip 101. The ADCs are connected to the parallel interface port 131. The interface 130 performs a multiplexing of the parallel provided digital information from the ADCs to the high speed serial output 131 so that the amount of external wiring of the image sensor is reduced. Chip 101 includes also pads 133, 134 to provide electrical power to the circuitry on chip 101 such as positive supply potential VDD and ground potential VSS.

The image sensor 100 includes an array of 8×8 pixels and circuit elements such as ADCs and a parallel/serial-interface, wherein these components can be manufactured from one side of the semiconductor substrate using a standard CMOS process. This avoids the necessity for contacts through the silicon such as through silicon vias. It may be manufactured efficiently and at low costs although providing sufficient image information and resolution so that it is suited for cost-effective computed tomography apparatuses. Depending on process technology, it is possible to include a larger array of photodiodes such as 16×16 or 32×32 photodiodes on one single chip.

The array of photodiodes is arranged close to edge 102 of the semiconductor substrate and distant from the opposite edge 103 of the substrate. The ADCs are arranged close to edge 103 and distant from edge 102. This allows that substrate portion 101 be subjected to radiation wherein the ADCs of portion 120 can be protected from radiation. There is a sufficiently large gap or distance 190 between the photodiodes and the ADCs. A gap is disposed between the first portion 110 and the second portion 120 of the substrate so that it is possible to provide good X-ray protection of the ADCs without affecting the reception of radiation in the photodiodes. On the other hand, distance 190 should be such that the power dissipation and the corresponding heat generated by the operation of the ADCs is substantially decoupled from the photodiodes opposite the ADCs such as photodiode 112h at the end of row 114. Since a temperature increase of a photodiode increases the leakage current of the photodiode, the heat decoupling gap 190 ensures uniform characteristics of the photodiodes throughout the array. In practice, gap 120 should be at least 100 μm. More practically, gap 190 could be more than 200 μm.

The photodiode array is covered with a scintillator that converts the X-ray radiation to radiation of longer wavelength such as visible light (not shown in FIG. 1). Other scintillators may convert the X-ray radiation to UV light or infrared light depending on the reception capabilities of the photodiodes. The scintillator converts the X-ray radiation to light that can be evaluated by the photodiodes. Although the largest portion of the light will be converted to light that can be used by the photodiodes, some minor portion of the X-ray radiation may be able to pass the scintillator layer so that the photodiodes must exhibit X-ray radiation tolerance.

The scintillator can be disposed as one continuous layer on the photodiode array or as an intermittent layer covering the photodiode area only with a gap between the photodiodes. Individual scintillator elements on the photodiodes provide a high level of optical isolation between neighboring photodiodes so that the optical cross-talk between adjacent photodiodes is almost avoided.

Figure 2:
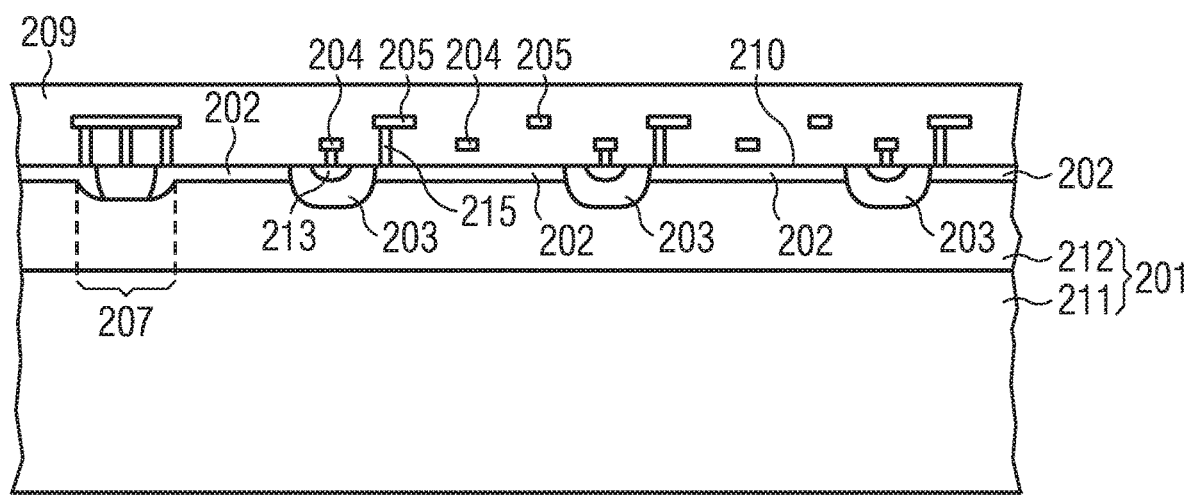
FIG. 2 shows a cross-sectional view of a portion of a photodiode.

Turning now to FIG. 2, a cross-sectional view through a portion of a photodiode is shown. Substrate 201 is composed of a bulk p-substrate 211 on which a p-epitaxial layer 212 is disposed. The epitaxial layer 212 includes a multitude of n-doped well regions 203. All regions are connected through a wiring layer 204 disposed in a dielectric layer 209 to form the cathode of the photodiode. The n-well region 203 includes a highly doped n+ region 213 to enable the contact to interconnection layer 204. For X-ray radiation tolerance, a p-doped surface layer 202 is provided between the n-well regions 203. P-doping regions 202 contact the n-well regions 203 and reduce the leakage currents that may be generated by the reception of X-ray radiation. P-surface doping regions 203 may be implanted from the surface 210 into the epitaxial layer 212 of the semiconductor substrate 201. The p-doping concentration of surface region 202 is higher than the p-doping concentration of the substrate layer 212. Additional wires 205 provide multiple contacts to the surface doping layer 202 to form a cathode terminal.

Figure 3:
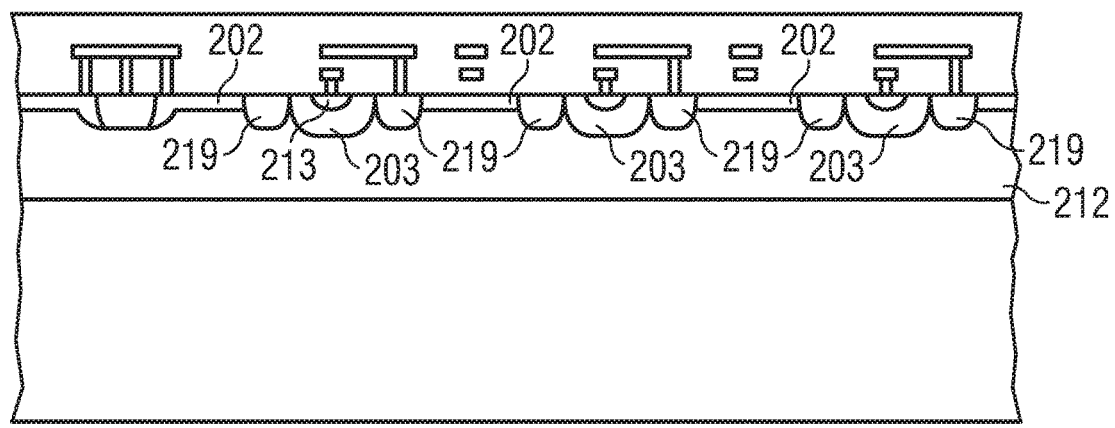
FIG. 3 shows another cross-sectional view of a portion of a photodiode.

FIG. 3 shows another cross-sectional view to a portion of a photodiode having an improved layer structure. FIG. 3 includes additional p-doping regions 219 that surround the n-well regions 203 in form of a ring shape. P-doping regions 219 contact the surface doping regions 202 and the n-well regions 203 so that they ensure a good contact between the surface doping regions 202 and the n-well regions 203 to avoid leakage currents from X-ray radiation. The diode structures depicted in FIGS. 2 and 3 are especially useful to form the photodiodes of the image sensor of FIG. 1. Other X-ray radiation tolerant photodiode structures apparent to a skilled person may also be useful.

Figure 4:
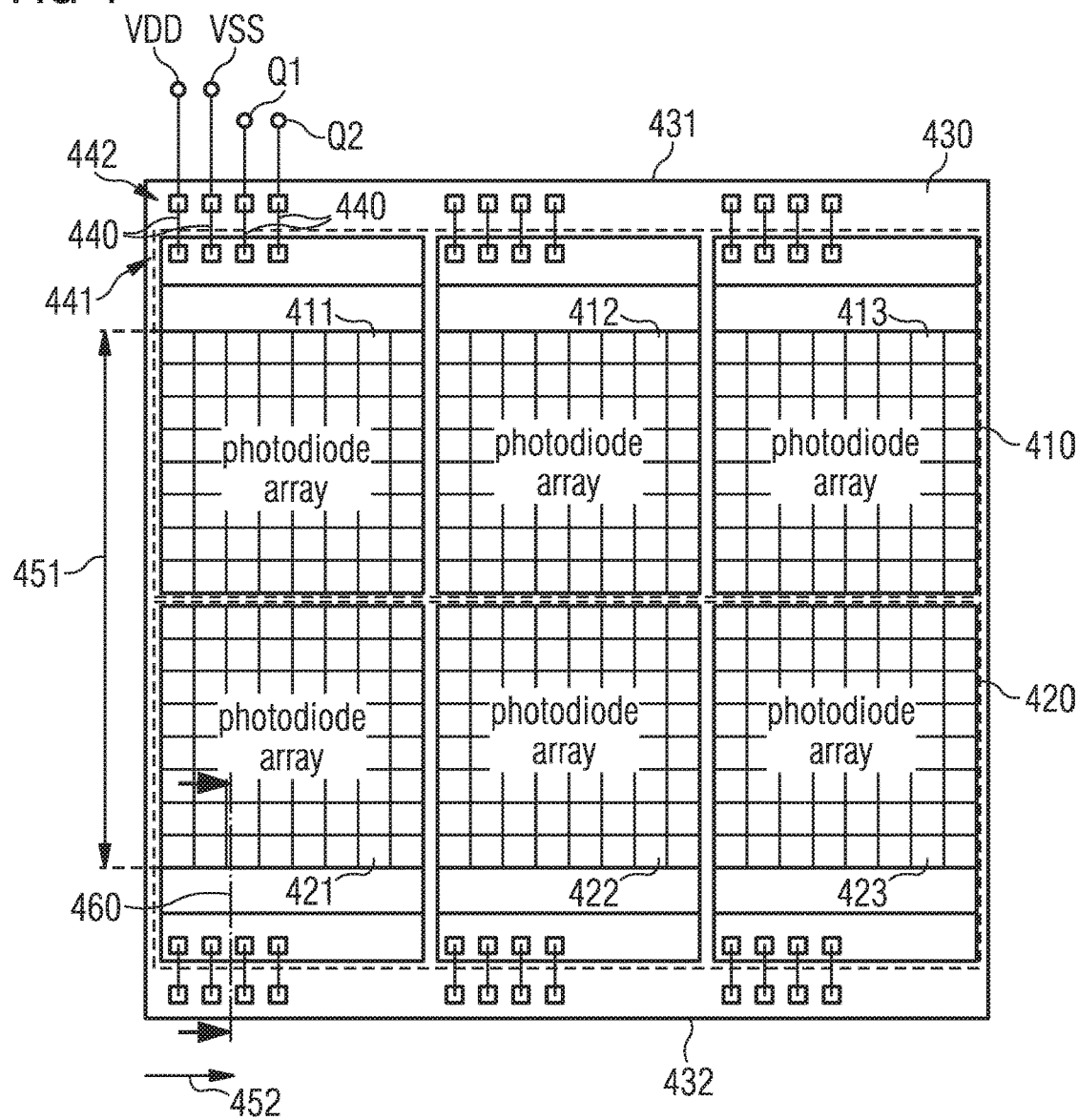
FIG. 4 shows a top view on an arrangement of image sensors comprising several image sensors.

Turning now to FIG. 4, several, e.g., 6 image sensors according to FIG. 1 are disposed in close spatial relationship on a substrate 430. Specifically, all sensors 411, 412, 413, 421, 422, 423 are mounted on substrate 430 in two adjacent rows 410, 420 extending in horizontal direction. The orientation of the photodiodes is such that the photodiodes of two rows such as photodiodes 412, 422 are disposed one adjacent to the other one wherein the photodiode arrays are disposed opposite one another. Accordingly, the edges 102 of the image sensors 412, 422 abut each other. In general, a number of N image sensors are arranged one next to the other in each row 410, 420 so that the arrangement on substrate 430 includes 2×N image sensors. While the first portion 110 of each image sensor faces a first portion 110 of another image sensor, the second portions 120 including the ADCs and the contact pads are distant from one another and face the opposite edges 431, 432 of substrate 430. The arrangement of components adjacent to image sensor 412 is such that the neighboring image sensors 411, 413 in horizontal direction 452 and the image sensor 422 in vertical direction 451 form a continuous array of photodiodes, wherein the image sensors are 3-side buttable. In vertical direction 451, a number of 16 photodiodes are arranged continuously so that the X-ray detector of a CT apparatus includes 16 slices of photodiodes extending in the horizontal direction 452. Depending on the size of the image sensor, 32 or 64 slices are also feasible.

The electrical contacts of the image sensors are disposed in the outer region of the sensors next to the edges 431, 432 of carrier substrate 430. Specifically, bond wires 440 provide electrical connection between pad terminals 441 disposed on each of the image sensor chips and pad terminals 442 disposed on the substrate 430. The pad terminals supply electrical power such as the operating voltage VDD, VSS to the image sensors and retrieve the image signals in the form of differential serial signals Q1, Q2 from the image sensors. The carrier substrate 430 may be a rigid substrate on which the image sensors are mounted with a glue. The substrate may be made of a ceramic material including one or more wiring layers to transport electrical signals and electrical power. Furthermore, the substrate 430 is used for heat dissipation to remove and dissipate the heat generated in the ADCs of the image sensors through suitable heat sinks or heat dissipaters. This requires good thermal conductivity between the image sensors and the heat sink and a close spatial relation between the ADCs of the image sensors and the heat sink. In an embodiment, the heat sink is mounted to the substrate 430 in close relation to the ADCs of the image sensors. The heat sink may be mounted to the edges 431, 432 of substrate 430. The glue material to mount the image sensors to substrate 430 should exhibit sufficient heat conductivity.

Figure 5:
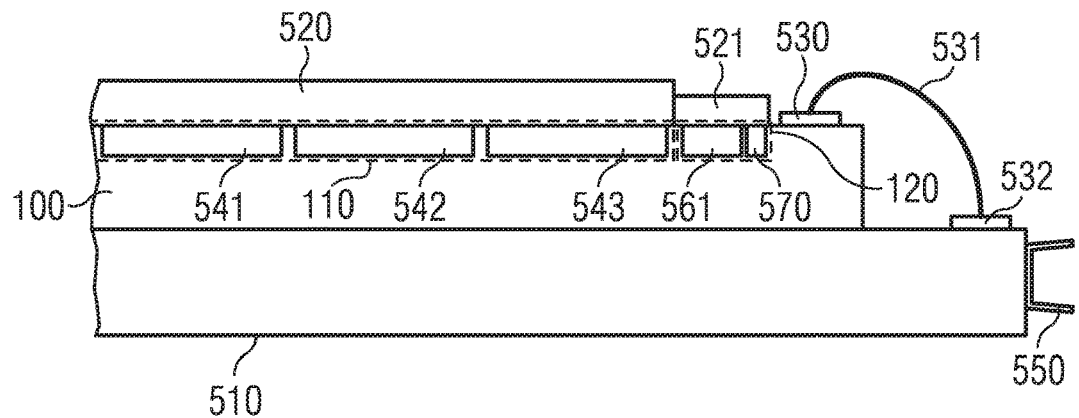
FIG. 5 shows a cross-sectional view of a portion of the image sensor arrangement of FIG. 4.

FIG. 5 shows a cross-section through the arrangement of FIG. 4 at line 460. FIG. 5 shows the portion 510 of the ceramic carrier substrate on which the semiconductor chip 100 is mounted. The illustrated portion of semiconductor chip 100 includes three photodiodes 541, 542, 543 disposed in the first substrate portion 110. The ADC 561 is situated next to photodiode 543. The parallel-to-serial interface 570 is situated next to ADC 561. An output of interface 570 is connected to bonding pad 530 disposed on the surface of chip 100. A corresponding bonding pad 532 is disposed on the surface of carrier substrate 510. A bond wire 531 connects pads 530 and 532. A heat sink 550 is mounted to the sidewall of substrate 510 next to the ADCs 561 and interface 570 that may generate substantial heat. The close spatial relation between ADC 561 and heat sink 550 allows a direct flow of heat from the ADC 561 to heat sink 550 so that the heat is removed from the neighboring photodiode 543.

A wavelength conversion layer 520 is disposed on the first portion 110 of chip 100. The wavelength conversion layer 520 is disposed on the photodiodes 541, 542, 543. Wavelength conversion layer 520 may be a scintillator that converts X-ray radiation to visible light that can be converted into electrical signals by the photodiodes. The scintillator layer 520 may extend (not shown) onto the second portion 120 of chip 100 including the ADC 561 and the interface 570. According to another embodiment shown in FIG. 5, the ADC 561 and the interface 570 are covered by an X-ray radiation shield layer 521 that shields ADC 561 and interface 570 from any X-ray radiation. The shield layer 521 extends over the full surface of the second portion 120 of the image sensor covering the electronic circuits in the second portion 120 of chip 100. The X-ray radiation shield 521 may be made of a material that is non-penetrateable by X-ray radiation so that it rejects any X-ray radiation such as a metal layer, e.g., tungsten. Other X-ray shielding metal materials may also be useful. A distance between the photodiode 543 neighboring the ADC 561 should be sufficiently large that no X-ray radiation is able to pass through a potential gap between scintillator 520 and X-ray radiation shield 521 to avoid X-ray radiation hitting the active substrate area of the semiconductor chip such as photodiode 543 or ADC 561.

Figure 6:
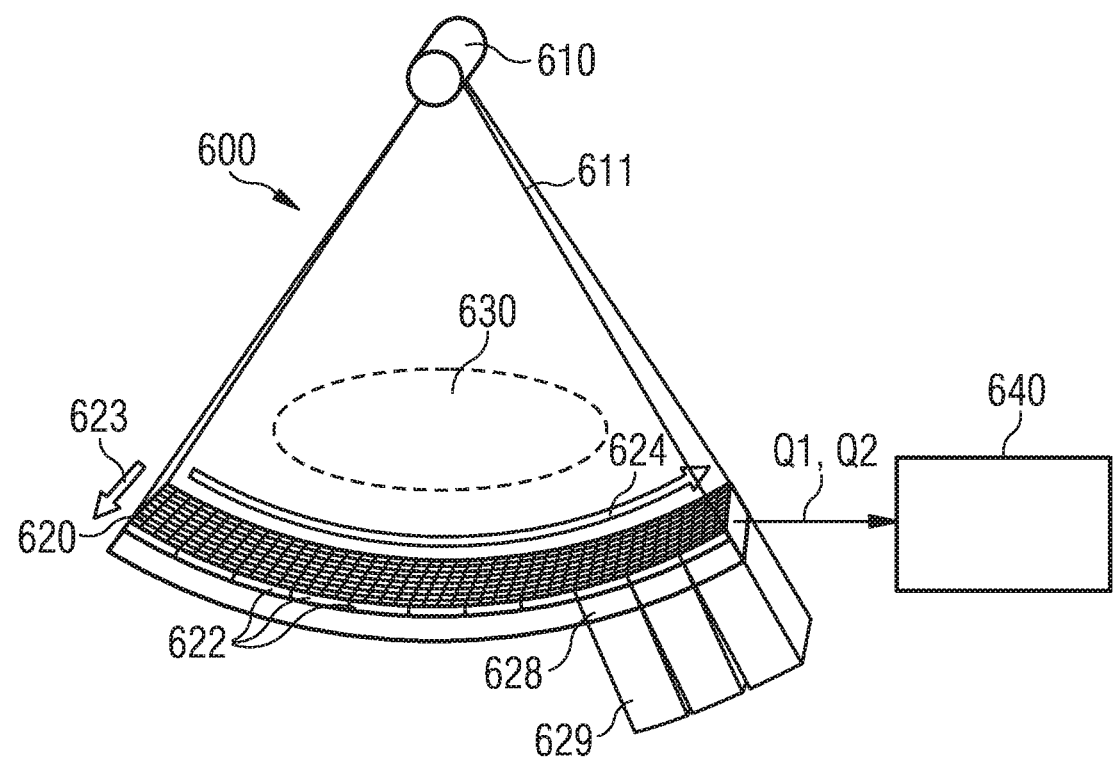
FIG. 6 shows a principle block diagram of a CT apparatus that includes several image sensor arrangements according to the principles shown in FIG. 4.

FIG. 6 shows a principle construction of a computed tomography apparatus 600 including the image sensors and the image sensor arrangements discussed above. An X-ray tube 610 continuously emits an X-ray radiation beam 611 having a defined aperture. The X-rays are received by an X-ray detector 620, which is composed of a number of about, e.g., 30 sensor arrangements 622 according to the principles discussed in connection with FIG. 4. The arrangement of X-ray tube 610 and X-ray detector 620 continuously rotates around an inner space 630 that is configured to receive a person, an animal or an object to be examined. The X-ray detector 620 exhibits a cylinder surface shape reception area that may have a width 623 in the range of 16 mm and a length 624 of about 1000 mm. Provided that a photodiode or pixel of the actual detector 620 has a square surface area of 1 mm×1 mm, 16 photodiodes are arranged along direction 620 and about 1000 photodiodes are arranged along direction 624. Each one of the sensor arrangements 622 comprises a set of 2×4=8 image sensors mounted on a ceramic substrate 628. Also attached to the ceramic substrate 628 is electronic circuitry 629 disposed on a printed circuit board that provides interfacing and connectivity to a computer 640. While the shown CT apparatus comprises 16 slices of photodiodes in detector 620 disposed one adjacent to the other along direction 623, a lower or a higher number of slices is also useful. Present manufacturing technology allows also the fabrication of image sensors of a suitable size so that even 32 or 64 slices are possible.

According to the working principle of a CT apparatus, image information Q1, Q2 is continuously received while rotating the arrangement of X-ray tube 610 and X-ray detector 620 around the individual or object in space 630. The individual or object in space 630 is moved along direction 623 so that several rotational X-ray images are recorded. The computer 640 generates one or more 2D or 3D representations of the individual or object in space 630 from the image information Q1, Q2 according to image processing algorithms known to a person skilled in the art of CT technology.

Aspects of the present disclosure describe an image sensor with one ADC per pixel wherein the ADCs are placed next to the photodiode array. The photodiode array itself contains an arrangement of photodiodes of, e.g., 8×8 pixels, which allows a simultaneous measurement of the photocurrent signals generated by the photodiodes. The partitioning of the semiconductor substrate chip into a photodiode portion and a portion including the ADCs allows a 3-side buttable image sensor that can be mounted on a substrate using wire bond technology. The sensor itself can be manufactured with standard CMOS process technology.

An arrangement of several 3-side buttable image sensors within two rows enables an X-ray detector for a CT apparatus of, e.g., 16 or more slices. Since the X-ray detector makes up for a major portion of the costs of a CT apparatus and can be manufactured efficiently with standard CMOS processing, it is particularly useful for cost-sensitive CT applications.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

The invention claimed is:

1. An image sensor, comprising:
a semiconductor substrate comprising a first portion and a second portion;
a multitude of photodiodes disposed in the first portion of the semiconductor substrate, the photodiodes exhibiting X-ray radiation tolerance;
analog-to-digital converters disposed in the second portion of the semiconductor substrate, each one of the analog-to-digital converters associated to one of the multitude of photodiodes; and
electrical connections, each one of the electrical connections connected to one of the multitude of photodiodes and to an associated one of the analog-to-digital converters.

2. The image sensor according to claim 1, wherein the photodiodes each comprise the semiconductor substrate having a first conductivity type, a doped well region disposed in the semiconductor substrate having a second conductivity type opposite the first conductivity type and facing a surface of the semiconductor substrate, a doped surface region disposed in the semiconductor substrate having the first conductivity type and a doping concentration higher than the semiconductor substrate and surrounding the doped well region.

3. The image sensor according to claim 2, wherein the photodiodes each further comprise another doped well region of the first conductivity type surrounding the doped well region and in contact with the doped well region and the doped surface region.

4. The image sensor according to claim 2, wherein the photodiodes each comprise a multitude of doped well regions of the second conductivity type interconnected with each other.

5. The image sensor according to claim 1, wherein the photodiodes each occupy an area of the semiconductor substrate in the range between 0.1 mm×0.1 mm and 2.5 mm×2.5 mm or between 0.5 mm×0.5 mm and 2.0 mm×2.0 mm or in the range of 1.0 mm×1.0 mm.

6. The image sensor according to claim 1, further comprising a wavelength conversion layer disposed on the multitude of photodiodes and one of a wavelength conversion layer and a X-ray radiation shield disposed on the analog-to-digital converters.

7. The image sensor according to claim 1, wherein the semiconductor substrate has a rectangular or squared shape and a first and a second edge disposed at opposite ends of the semiconductor substrate wherein each one of the first and second portions is continuous and includes one of the first and second edges.

8. The image sensor according to claim 1, further comprising a parallel to serial interface having a parallel port and a serial port of which the analog-to-digital converters are connected to a parallel port and an at least one serial output terminal is connected to the serial port.

9. The image sensor according to claim 1, wherein subsets of the photodiodes are arranged in rows, the rows disposed one adjacent to another one, wherein the analog-to-digital converters associated to the photodiodes of one of the rows are disposed opposite the photodiode forming an end of said row, wherein a distance between the photodiode forming the end of the row and the analog-to-digital converters associated to the photodiodes of said row is at least 100 µm or at least 200 µm.

10. The image sensor according to claim 1, wherein the multitude of photodiodes is disposed in a matrix comprising rows and columns, the analog-to-digital converters associated to the photodiodes of one of the rows are disposed in spatial vicinity aligned with said one of the rows, wherein the semiconductor substrate has a rectangular shape having at least two parallely disposed edges, the photodiodes disposed proximate one of the edges and distant from another one of the edges and the analog-to-digital converters disposed proximate the other one of the edges and distant from the one of the edges, wherein the electrical connections extend in a space between two adjacent rows of photodiodes.

11. The image sensor according to claim 1, wherein the semiconductor substrate comprises a first continuous portion and a second continuous portion, the first and second continuous portions being non-overlapping.

12. The image sensor according to claim 1, wherein each one of the analog-to-digital converters is associated to one of the multitude of photodiodes in a one-to-one relation.

13. The image sensor according to claim 1, wherein the multitude of photodiodes is disposed in a matrix comprising rows and columns, the rows disposed one adjacent to another one, wherein the analog-to-digital converters associated to the photodiodes of one of the rows are disposed opposite the photodiode forming an end of said row and are aligned with said one of the rows, wherein a distance between the analog-to-digital converters associated to the photodiodes of said row and the photodiode forming the end of the row next to the analog-to-digital converters associated to the photodiodes of said row is at least 100 µm or at least 200 µm, wherein the semiconductor substrate has a rectangular shape having at least two parallely disposed edges, the photodiodes disposed in the first continuous portion proximate one of the edges and distant from another one of the edges and the analog-to-digital converters disposed in the second continuous portion non-overlapping with the first continuous portion proximate the other one of the edges and distant from the one of the edges, and wherein the electrical connections extend in a space between two adjacent rows of photodiodes.

14. An image sensor arrangement, comprising:
a carrier substrate;
one or more image sensors, each of the one or more image sensors comprising:
  a semiconductor substrate comprising a first portion and a second portion;
  a multitude of photodiodes disposed in the first portion of the semiconductor substrate, the photodiodes exhibiting X-ray radiation tolerance;
  analog-to-digital converters disposed in the second portion of the semiconductor substrate, each one of the analog-to-digital converters associated to one of the multitude of photodiodes; and
  electrical connections, each one of the electrical connections connected to one of the multitude of photodiodes and to an associated one of the analog-to-digital converters, wherein the image sensors mounted on the carrier substrate in a first and a second row, wherein each one of the first portions of the semiconductor substrates of one or more image sensors of the first row is disposed adjacent to one of the first portions of the semiconductor substrates of one or more image sensors of the second row.

15. The image sensor arrangement according to claim 14, wherein a wavelength conversion layer is disposed on the first portions of the image sensors of each one of the first and second rows and one of a wavelength conversion layer and a X-ray radiation shield is disposed on the second portions of the image sensors of first and second rows.

16. The image sensor arrangement according to claim 15, further comprising bond wires connected to pad terminals disposed on the semiconductor substrates of the image sensors and to pad terminals disposed on the carrier substrate to supply electrical power to the image sensors or output electrical signals containing image information received by the photodiodes from the image sensors.

17. The image sensor arrangement according to 14, further comprising at least one heat dissipater mounted to the carrier substrate in vicinity to the second portions of the semiconductor substrates of the rows of image sensors to allow a direct flow of heat generated from the analog-to-digital converters to the at least one heat dissipater.

18. A computed tomography apparatus, comprising:
an X-ray tube;
an X-ray detector disposed to receive radiation emitted by the X-ray tube, the X-ray detector comprising a multitude of image sensor arrangements disposed one adjacent to another, each of the multitude of image sensor arrangements comprising:
  a carrier substrate;
  image sensors, each image sensor comprising:
    a semiconductor substrate comprising a first portion and a second portion;
    a multitude of photodiodes disposed in the first portion of the semiconductor substrate, the photodiodes exhibiting X-ray radiation tolerance;
    analog-to-digital converters disposed in the second portion of the semiconductor substrate, each one of the analog-to-digital converters associated to one of the multitude of photodiodes; and
    electrical connections, each one of the electrical connections connected to one of the multitude of photodiodes and to an associated one of the analog-to-digital converters, wherein the image sensors are mounted on the carrier substrate in a first and a second row, wherein each one of the first portions of the semiconductor substrates of one or more image sensors of the first row is disposed adjacent to one of the first portions of the semiconductor substrates of one or more image sensors of the second row;
a space to receive a subject or an object, wherein the X-ray tube and the X-ray detector are configured to rotate around the space;
a computer connected to the X-ray detector to receive image information received by the sensor arrangements of the X-ray detector and configured to compute at least one two- or three-dimensional representation from the received image information.

* * * * *